United States Patent
Govindasamy et al.

(10) Patent No.: US 8,810,354 B2
(45) Date of Patent: Aug. 19, 2014

(54) BINARY CODED DECIMAL RESISTIVE LOAD AND NETWORK

(71) Applicant: Eaton Corporation, Cleveland, OH (US)

(72) Inventors: Bhuvan Govindasamy, Rancho Santa Margarita, CA (US); Habib Baydoun, Huntington Beach, CA (US); Brian Pham, Monterey Park, CA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 13/738,676

(22) Filed: Jan. 10, 2013

(65) Prior Publication Data

US 2014/0191840 A1    Jul. 10, 2014

(51) Int. Cl.
*H01C 10/50* (2006.01)

(52) U.S. Cl.
USPC .......................... 338/200; 338/333; 338/334

(58) Field of Classification Search
USPC .................................. 338/200, 215, 333, 334
See application file for complete search history.

(56) References Cited

U.S. PATENT DOCUMENTS

| | | | |
|---|---|---|---|
| 3,624,495 A | 11/1971 | Freund | |
| 3,732,507 A | 5/1973 | Christiansen et al. | |
| 3,810,012 A | 5/1974 | Harris | |
| 4,227,172 A | 10/1980 | Sherman | |
| 4,276,508 A | 6/1981 | Usugi | |
| 4,468,607 A | 8/1984 | Tanaka et al. | |
| 4,494,733 A * | 1/1985 | Olsson | 256/10 |
| 4,502,146 A | 2/1985 | D'Antonio | |
| 4,849,903 A | 7/1989 | Fletcher et al. | |
| 4,994,733 A | 2/1991 | Yasunaga | |
| 5,045,832 A | 9/1991 | Tam | |
| 5,319,345 A | 6/1994 | Abe et al. | |
| 5,363,070 A | 11/1994 | Arimoto | |
| 5,451,881 A | 9/1995 | Finger | |
| 5,717,323 A | 2/1998 | Tailliet | |
| 5,723,915 A | 3/1998 | Maher et al. | |
| 6,487,456 B1 | 11/2002 | Masano et al. | |
| 6,501,450 B1 | 12/2002 | Bjerke | |
| 6,503,649 B1 | 1/2003 | Czajkowski et al. | |
| 7,071,669 B2 | 7/2006 | Morita | |
| 7,339,362 B2 | 3/2008 | Kuo | |
| 2002/0106058 A1 | 8/2002 | Swale | |
| 2009/0234600 A1 | 9/2009 | Matsumoto | |

FOREIGN PATENT DOCUMENTS

JP    06-062537    3/1994

OTHER PUBLICATIONS

European Patent Office, International Search Report and Written Opinion issued in counterpart International Application No. PCT/US2014/010877. Date of Mailing: Apr. 25, 2014.

* cited by examiner

*Primary Examiner* — Kyung Lee
(74) *Attorney, Agent, or Firm* — Blakely Sokoloff Taylor & Zafman

(57) ABSTRACT

An embodiment of an apparatus for providing a variable resistance may be configured to provide a resistance value according to a binary-coded decimal scheme. The apparatus may be referred to herein as a BCD variable resistance apparatus. The BCD variable resistance apparatus may include a plurality of resistive elements and a plurality of switches. In an embodiment, the resistive elements may be coupled with respective switches in a binary-coded decimal scheme.

18 Claims, 4 Drawing Sheets

BINARY CODED DECIMAL RESISTIVE LOAD AND NETWORK

BACKGROUND

1. Technical Field

The present disclosure relates to electrical power supplies, including apparatus and methods for providing a variable resistance to test such power supplies.

2. Description of the Related Art

Electrical power supplies are used in a variety of applications in the field of electronics. If a power supply is not performing as desired, it may damage electrical components to which it is connected. Thus, it may be desirable to verify the performance of an electrical power supply before or after using that power supply for its intended application. This verification may involve providing a variable load to the power supply and assessing the response of the power supply.

One known device for testing a power supply is a decade box. A decade box generally requires manual switching to adjust the load provided for the power supply. However, decade boxes are generally not designed for high-power applications, so their use is limited. Furthermore, even if decade boxes could be used for a wider range of applications, significant user input would be required to test a single power supply at several voltages due to the manual switching design of decade boxes.

Other manually-switched variable-load devices are also known in the art. For example, a potentiometer may be used to test a power supply. However, like decade boxes, potentiometers are generally not designed for high-power applications, and thus have limited use. Furthermore, also like decade boxes, significant user input would be required to use a potentiometer to test a wide load range for a power supply, and control over the load may be imprecise.

SUMMARY

An embodiment of an apparatus configured to provide a variable resistance may comprise a plurality of resistive elements, each resistive element having a respective resistance, and a plurality of switches. Each of the switches may be coupled to a respective one of the plurality of resistive elements, and each of the switches may be configured to selectively include the respective one of the resistive elements in the variable resistance. The resistive elements and the switches may be arranged in a binary-coded decimal scheme.

Another embodiment of an apparatus configured to provide a variable resistance may comprise a plurality of switched resistive elements, each resistive element having a respective resistance, the resistive elements grouped to provide a variable resistance according to a binary-coded decimal value. The resistive elements may be configured for automatic switching to selectively contribute to the variable resistance.

An embodiment of a method may comprise providing an apparatus comprising a plurality of resistive elements, each resistive element having a respective resistance, and a plurality of switches, each of the switches coupled to a respective one of the plurality of resistive elements, each of the switches configured selectively include the respective one of the resistive elements in the variable resistance. The resistive elements and the switches may be arranged in a binary-coded decimal scheme. The method may further comprise automatically actuating the switches to provide a predetermined sequence of resistances.

In embodiments, the BCD variable resistance apparatus may provide a wide range of resistances in a wide range of electrical power conditions and may be used to provide a selected resistance for a prototype circuit to determine to appropriate resistance to be included in the final version of the circuit. In the same or another embodiment, the apparatus may be used to tune a control loop or circuit. In the same or another embodiment, the apparatus may be used to test and verify performance of a power supply at one or more resistances.

BRIEF DESCRIPTION OF THE DRAWINGS

Embodiments of the invention will now be described, by way of example, with reference to the accompanying drawings, wherein.

DETAILED DESCRIPTION

Reference will now be made in detail to embodiments of the present invention, examples of which are described herein and illustrated in the accompanying drawings. While the invention will be described in conjunction with embodiments, it will be understood that they are not intended to limit the invention to these embodiments. On the contrary, the invention is intended to cover alternatives, modifications and equivalents, which may be included within the spirit and scope of the invention as defined by appended claims.

Figure 1:
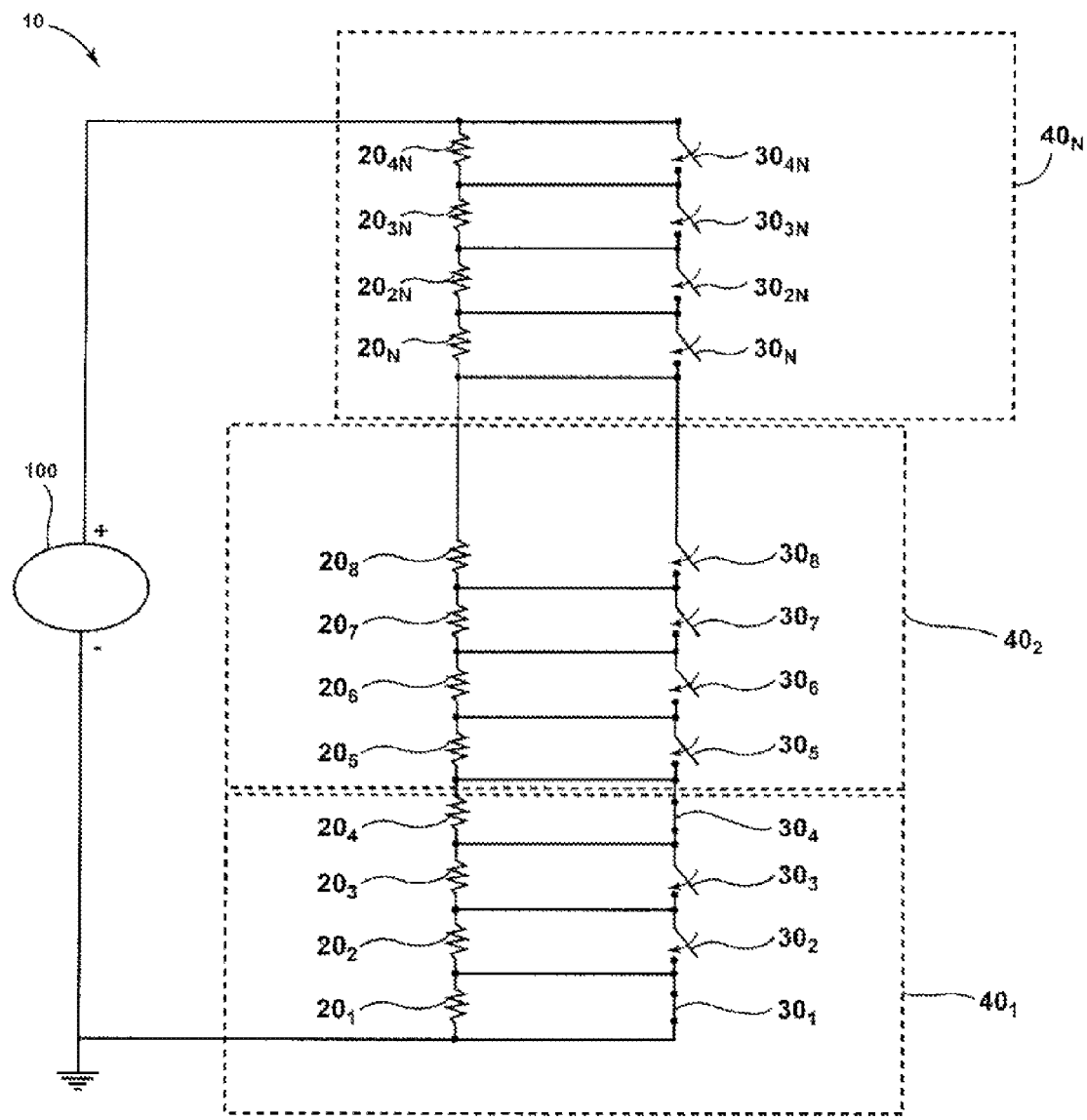
FIG. 1 is a schematic view of an embodiment of a variable resistance apparatus configured to provide a binary-coded decimal resistance value.

FIG. 1 is a schematic view of an embodiment of a variable resistance apparatus 10 configured to provide a binary-coded decimal resistance value. The apparatus 10 may be configured to provide a resistance value according to a binary-coded decimal (BCD) scheme and may be referred to herein as a BCD variable resistance apparatus 10. The BCD variable resistance apparatus 10 may include a plurality of resistive elements 20 and a plurality of switches 30 in a plurality of groups 40.

Each resistive element 20 may be a single, a plurality, or a combination of resistors, transistors, or other components capable of providing a known resistance. The resistive elements may be configured to be arranged in series to provide a selected resistance, in an embodiment. In other embodiments, the resistive elements may be configured to be arranged in parallel, or partially in parallel and partially in series. Each resistive element 20 may have a respective resistance determined according to the BCD scheme.

The switches may be provided to alter the value of the resistance provided by the apparatus. Each of the switches 30 may be coupled to one or more of the resistive elements 20 to selectively include the one or more resistive elements 20 in a resistive path 50. The resistive path may determine the variable resistance presented by the apparatus. A switch 30 may take a variety of forms, including, without limitation, a transistor, such as a metal-oxide-semiconductor field-effect transistor (MOSFET), for example, or other semiconductor device.

The resistive elements 20 and switches 30 may be grouped into a number N of groups 40. In an embodiment, such as that shown in FIG. 1, three groups $40_1$, $40_2$, and $40_N$ are shown, each group 40 having four resistive elements 20 respectively coupled to four switches 30. Each of the resistive elements 20 in a group 40 may have a resistance on the same order as each other resistive element 20 within that group 40. For example, the resistive elements 20 in a group 40 may each have respective resistances between 0 ohms and 1 ohm. In an embodiment, each group 40 may include four resistive elements 20 having respective resistances of about $1 \times 10^X$, $2 \times 10^X$, $4 \times 10^X$, and $8 \times 10^X$ ohms, where X may be a positive or negative integer or zero.

Figure 2:
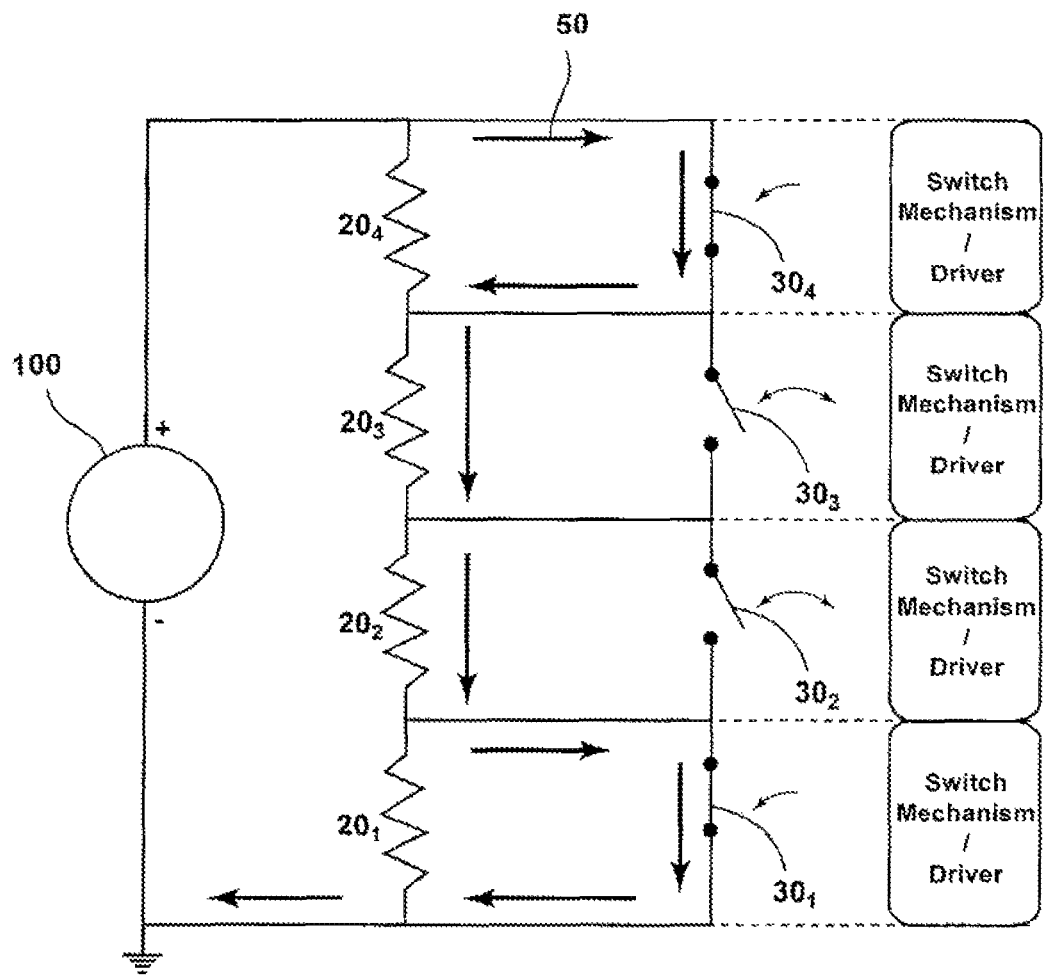
FIG. 2 is a schematic view of an exemplary state of an embodiment of a binary-coded decimal resistor group.

FIG. 2 is a schematic view of an exemplary state of an embodiment of a binary-coded decimal resistive element group 40. The resistive element group is illustrated as the first group $40_1$ shown in FIG. 1, but is not so limited. The resistive element group $40_1$ may include four resistive elements $20_1$-$20_4$ coupled to four switches $30_1$-$30_4$, respectively, and to the power supply 100. The switches 30 may be individually and independently actuated (i.e., opened and closed), in an embodiment, to connect selected ones of the resistive elements 20 to a resistive path 50. For example, switches $30_2$ and $30_3$ may be opened to place resistive elements $20_2$ and $20_3$ in a resistive path 50 in which resistive elements $20_2$ and $20_3$ to contribute to the variable resistance. Switches $30_1$ and $30_4$ may be closed to remove resistive elements $20_1$ and $20_4$ from the resistive path 50 such that resistive elements $20_1$ and $20_4$ are excluded from (i.e., do not contribute to) the variable resistance.

More generally, an open switch 30 may correspond to the respective resistive element 20 to which the switch 30 is coupled contributing its resistance to the resistive path determining the variable resistance 50. A closed switch 30 may correspond to the respective resistive element to which the switch is coupled not contributing its resistance to the resistive path determining the variable resistance 50. Of course, in an embodiment, this may be reversed—i.e., a closed switch may correspond with a resistive element being placed in the resistive path 50, and an open switch may correspond with a resistive element being removed from the resistive path 50.

As noted above, the resistive elements 20 and switches 30 may be arranged in a BCD scheme 50. A binary-coded decimal, as opposed to a traditional binary representation of a decimal, is an encoded decimal number wherein each decimal digit corresponds to four binary digits (i.e. resistive elements). The first binary digit has potential values of 0 or 1, the second has potential values of 0 or 2, the third has potential values of 0 or 4, and the fourth has potential values of 0 or 8. Thus, four bits combined may represent a value between zero, represented as 0000, and nine, represented as 1001. Multiple sets of four bits can be used to represent decimals having more than one digit. For example, the decimal four corresponds to the binary-coded decimal 0100 and the decimal fourteen corresponds to the binary-coded decimal 0001 0100.

Referring to FIGS. 1 and 2, in an embodiment of the BCD variable resistance apparatus 10, each group 40 may correspond to a respective digit of a decimal and the four resistive elements 20 in each group 40 may correspond to the four binary digits associated with each decimal digit. In an embodiment, an open switch (i.e., switches $30_2$, $30_3$) may include the resistive element to which it is coupled (i.e., resistive elements $20_2$, $20_3$) in the resistive path such that the resistive elements 20 contribute to the variable resistance provided by the apparatus 10. Conversely, in an embodiment, a closed switch (i.e., switches $30_k$, $30_4$) may remove the resistive element to which it is coupled (i.e., resistive elements $20_1$, $20_4$) from the resistive path such that the resistive elements 20 are excluded from the variable resistance provided by the apparatus.

In an embodiment of a BCD scheme, each group 40 may comprise four resistive elements 20 and the total variable resistance presented by the apparatus 10 may be calculated according to formula (1) below:

$$R_{TOTAL(LOAD)} = 0.1 \sum_{i_2=1}^{N} \left[ 10^{i_2-1} \left( \sum_{i_z=1}^{4} 2^{i_z-1} \right) \right] \quad (1)$$

where $i_1$=Group Number and $i_2$=Resistive Element (20) within group $i_1$.

The apparatus 10 may be used for a number of purposes. In an embodiment, the apparatus 10 may be used to provide a selected resistance for a prototype circuit to determine an appropriate resistance to be included in the final version of the circuit. In the same or another embodiment, the apparatus may be used to tune a control loop or circuit. In the same or another embodiment, the apparatus may be used to test and verify performance of a power supply at one or more resistances.

Figure 3:
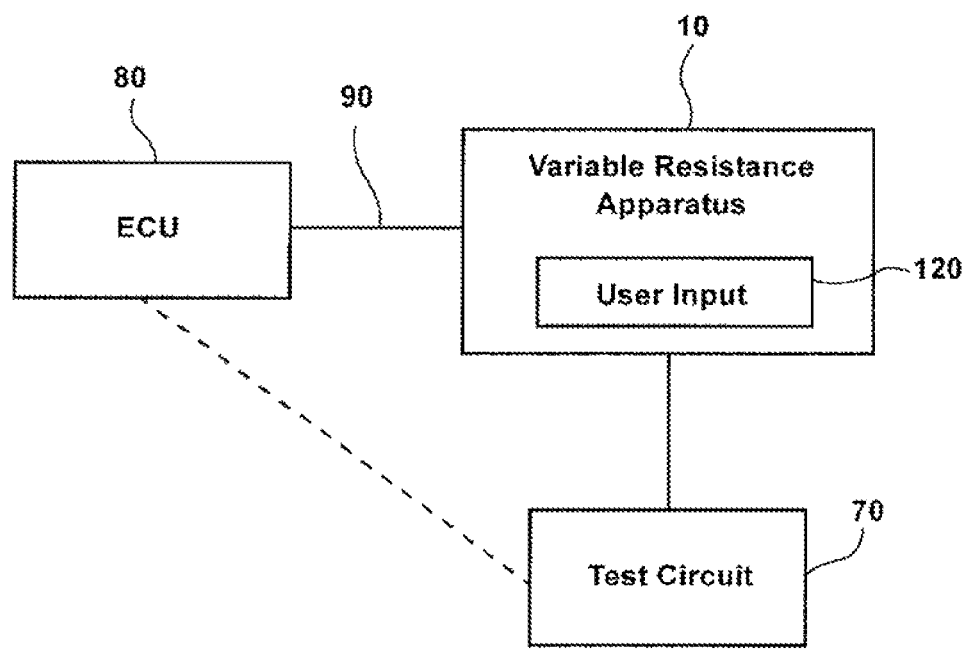
FIG. 3 is a diagram of an embodiment of a variable resistance apparatus configured for automatic operation.

FIG. 3 is a block diagram of an embodiment of a system including an embodiment of the BCD variable resistance apparatus 10, an electronic control unit (ECU) 80, and a test circuit 70. The test circuit 70 may be a prototype circuit, a power supply, or any other circuit to which the BCD variable resistive apparatus 10 may be coupled to provide a variable resistance. In an embodiment, the test circuit 70 may be the power supply 100 (see FIG. 1). Accordingly, the system will be described below with reference to an embodiment in which the test circuit 70 is the power supply 100 for ease of description, but it should be understood that neither the test circuit 70 nor the apparatus 10 is so limited.

Both the ECU 80 and the variable resistance apparatus 10 may be configured for handheld use, in an embodiment. The ECU 80 and the variable resistance apparatus 10 may be the same device or part of the same device, in an embodiment.

Referring to FIGS. 1 and 3, the ECU 80 may be coupled to the apparatus 10 and may be configured to control switches 30 and/or a power supply 100. The coupling 90 between the ECU 80 and the apparatus 10 may include any wired or wireless connection known in the art. In an embodiment, the ECU 80 may also be coupled to the power supply 100 in order to receive output from the power supply 100, for example. The ECU 80 may be configured to receive user input 110 from a user via a plurality of user input knobs, switches, buttons and/or other user input devices and/or mechanisms. The input 110 may include a desired resistance. The input 110 may cause the ECU 80 to actuate the switches 30 to cause the BCD variable resistance apparatus 10 to provide a desired resistance.

The ECU 80 may also be configured to perform a routine to automatically provide a sequence of different resistances to the power supply 100 with the apparatus 10. To provide the sequence, the ECU 80 may actuate the switches 30 to provide different resistances. An example of one such routine will be described in conjunction with FIG. 4.

The ECU 80 may comprise a programmable microprocessor or microcontroller, or may comprise an application specific integrated circuit (ASIC), for example. The ECU 80 may include a central processing unit (CPU), memory, and an input/output (I/O) interface. The ECU 80 may be configured to perform various functions, such as those described in greater detail above and below, with appropriate programming instructions or code embodied in software, such as LabVIEW, hardware, and/or other medium.

Figure 4:
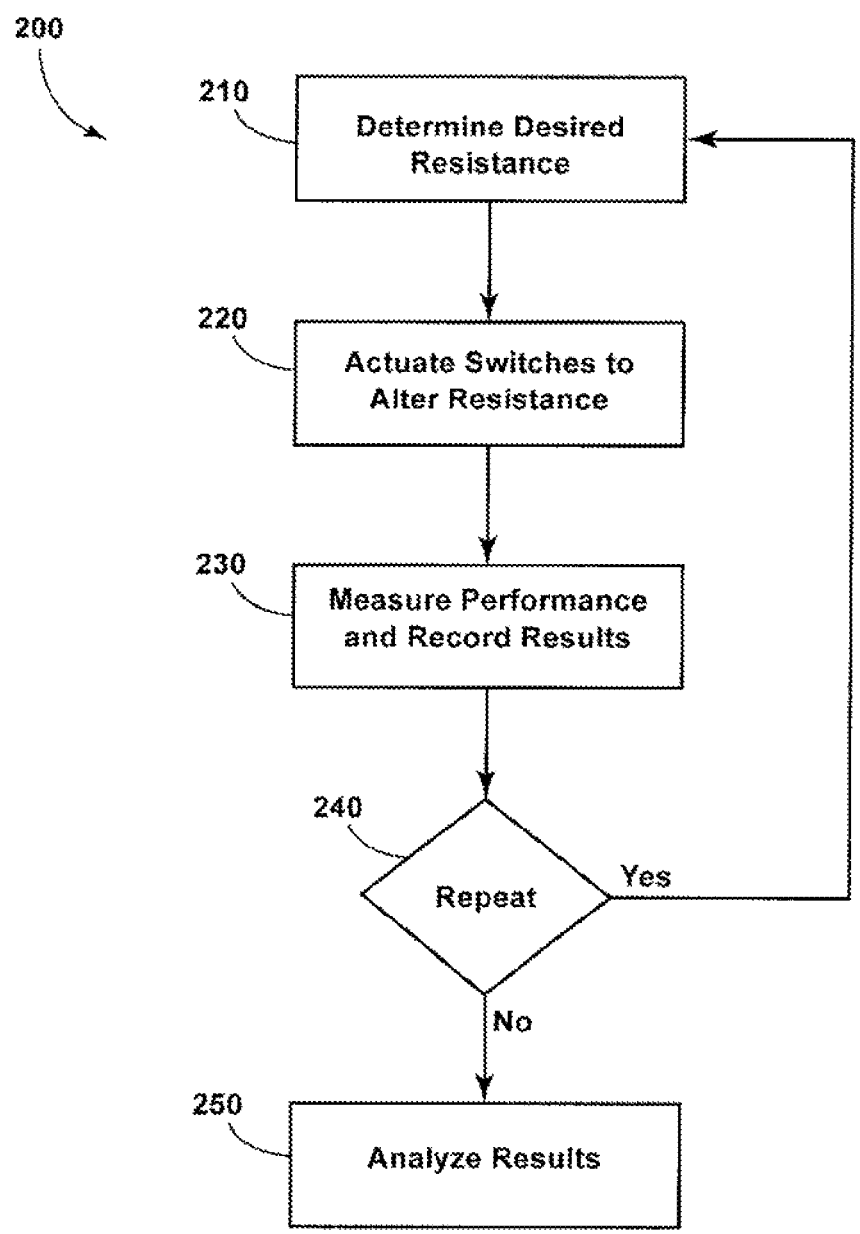
FIG. 4 is a flow chart illustrating a method of verifying the performance of a power supply with a variable resistance apparatus configured to provide a binary-coded decimal resistance value.

FIG. 4 is a flow chart illustrating an exemplary embodiment of a method of providing a sequence of resistances with the apparatus 10 to, for example, automatically test the performance of a power supply at a number of resistance values. Referring to FIGS. 3 and 4, the method may begin with a step 210 of determining a desired resistance. The desired resistance may be determined according to user input and/or according to a set of resistance values stored or determined by the ECU 80. Once an appropriate resistance is determined, the method 200 may continue to a step 220 of actuating switches within the apparatus 10 to alter the resistance provided by the apparatus 10. As noted above, one or more switches 30 in the apparatus 10 may be opened or closed to include or exclude one or more resistive elements 20 in a resistance path 50 to alter the variable resistance.

For each resistance provided by the apparatus 10, in an embodiment, the method 200 may continue to a step 230 of measuring the performance of the test circuit and recording the result. The measurement and recordation step 230 may include, for example, measuring and recording a current output by the test circuit 70, including a steady-state current and/or a current waveform, and/or filtering or otherwise processing an output waveform.

The method 200 may continue to a query step 240 to determine if further measurements are desired. For example, if more than one resistance is desired for testing, the steps (i.e., steps 210, 220, 230, and 240) can be repeated. If the performance of the device or system has been recorded at all desired resistances, the results may then be compiled and analyzed in analysis step 250.

Systems and apparatus according to the present disclosure may provide several advantages over known systems. For example, and without limitation, in an embodiment, such systems and apparatus may be operable at high levels of electrical power, may provide extremely high and/or extremely low resistance values, and may provide more precise resistance values at both high and low resistances. Such apparatus, in an embodiment, may also be configured for manual or automatic use, or automatic and manual use simultaneously. Systems and apparatus according to the present disclosure, in an embodiment, may also provide a wide range of resistance values with relatively few resistive elements, if desired. In an embodiment, a BCD variable resistance apparatus 10 may also allow for a more intuitive and/or simpler relation between system and desired resistance value because a desired value may be input in a base ten format and the BCD apparatus 10 may use, at least in part, base ten. The apparatus 10, in an embodiment, may also be bidirectional.

The foregoing descriptions of specific embodiments of the present invention have been presented for purposes of illustration and description. They are not intended to be exhaustive or to limit the invention to the precise forms disclosed, and various modifications and variations are possible in light of the above teaching. For example it should be understood that the switch and resistive elements disclosed herein could be modified such that a closed switch would include a resistive element in the resistive path. Also, it should be understood that a sequence may be ascending, descending, or neither. The embodiments were chosen and described in order to explain the principles of the invention and its practical application, to thereby enable others skilled in the art to utilize the invention and various embodiments with various modifications as are suited to the particular use contemplated. It is intended that the scope of the invention be defined by the claims and their equivalents.

What is claimed:

1. An apparatus configured to provide a variable resistance, comprising:
   a plurality of resistive elements, each resistive element having a respective resistance; and
   a plurality of switches, each of the switches coupled to a respective one of the plurality of resistive elements, each of the switches configured to selectively include the respective one of the resistive elements in said variable resistance;
   wherein the resistive elements and the switches are arranged in a binary-coded decimal scheme, wherein the plurality of resistors are arranged in a plurality of resistor groups, wherein each resistor group comprises four resistors having respective resistances of about $1\times10^X$, about $2\times10^X$, about $4\times10^X$, and about $8\times10^X$, where X is an integer.

2. The apparatus of claim 1, wherein each resistor within a single resistor group has a respective resistance on the same order as each other resistor within the single resistor group.

3. The apparatus of claim 1, wherein each resistor group has a respective value of X, wherein the respective resistance of each resistor in a group is determined according to the group's respective value of X.

4. The apparatus of claim 1, wherein a variable combined resistance of one of the resistor groups is about $1\times10^N$ ohms to about $15\times10^N$ ohms, where N is an integer.

5. The apparatus of claim 4, wherein each resistor group has a different value of N according to which the variable combined resistance of the resistor group is determined.

6. The apparatus of claim 1, wherein the apparatus is configured for automatic and manual use.

7. The apparatus of claim 1, wherein an open switch includes a respective resistive element in said variable resistance.

8. The apparatus of claim 1, wherein said variable resistance is bidirectional.

9. A method comprising:
   providing an apparatus comprising:
      a plurality of resistive elements, each resistive element having a respective resistance; and
      a plurality of switches, each of the switches coupled to a respective one of the plurality of resistive elements, each of the switches configured selectively include the respective one of the resistive elements in the variable resistance;
   wherein the resistive elements and the switches are arranged in a binary-coded decimal scheme, wherein the plurality of resistors are arranged in a plurality of resistor groups, wherein each resistor group comprises four resistors having respective resistances of about $1\times10^X$, about $2\times10^X$, about $4\times10^X$, and about $8\times10^X$, where X is an integer; and
   automatically actuating the switches to provide a predetermined sequence of resistances.

10. The method of claim 9, wherein the automatically actuating step comprises actuating different ones of the plurality of switches to provide a sequence of ascending and/or descending resistances for said power supply.

11. The method of claim 9, wherein an open switch corresponds to the respective resistive element contributing to the variable resistance.

12. The method of claim 9, wherein the automatically actuating step comprises opening at least one of the plurality of switches to decrement the variable resistance.

13. The method of claim 9, where in the automatically actuating step is performed according to instructions contained in computer software.

14. The method of claim 13, wherein a maximum value of the variable resistance is provided when all of the switches are open.

15. An apparatus configured to provide a variable resistance, comprising:
a plurality of switched resistive elements, each resistive element having a respective resistance, the resistive elements grouped to provide a variable resistance according to a binary-coded decimal value, wherein the plurality of resistors are arranged in a plurality of resistor groups, wherein each resistor group comprises four resistors having respective resistances of about $1 \times 10^X$, about $2 \times 10^X$, about $4 \times 10^X$, and about $8 \times 10^X$, where X is an integer;
wherein the resistive elements are configured for automatic switching to selectively contribute to the variable resistance.

16. The apparatus of claim 15, further comprising a plurality of switches, wherein each of the plurality of switches is coupled to a respective one of the plurality of resistive elements.

17. The apparatus of claim 16, wherein a maximum value of the variable resistance corresponds to all of the switches being open.

18. The apparatus of claim 16, wherein a minimum value of the variable resistance corresponds to all of the switches being closed.

* * * * *